(12) United States Patent
Iizuka

(10) Patent No.: US 8,479,063 B2
(45) Date of Patent: Jul. 2, 2013

(54) FAILURE ANALYZING DEVICE AND FAILURE ANALYZING METHOD

(75) Inventor: Yoshikazu Iizuka, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 238 days.

(21) Appl. No.: 12/966,687

(22) Filed: Dec. 13, 2010

(65) Prior Publication Data

US 2012/0036405 A1     Feb. 9, 2012

(30) Foreign Application Priority Data

Aug. 4, 2010   (JP) ................. 2010-175400

(51) Int. Cl.
*G11C 29/00*     (2006.01)

(52) U.S. Cl.
USPC ......................................... 714/723; 365/200

(58) Field of Classification Search
USPC ........................................ 714/723; 365/200
See application file for complete search history.

(56) References Cited

U.S. PATENT DOCUMENTS

| | | | | |
|---|---|---|---|---|
| 6,016,278 A * | 1/2000 | Tsutsui et al. | ................ | 365/200 |
| 6,108,253 A * | 8/2000 | Ohta | ................ | 365/201 |
| 6,775,796 B2 * | 8/2004 | Finkler et al. | ................ | 714/723 |
| 8,190,952 B2 * | 5/2012 | Ho et al. | ................ | 714/723 |
| 8,239,712 B2 * | 8/2012 | Hishinuma et al. | ........... | 714/723 |
| 2008/0082874 A1 * | 4/2008 | Kato | ............................. | 714/723 |
| 2012/0011421 A1 | 1/2012 | Kodama et al. | | |

FOREIGN PATENT DOCUMENTS

| | | |
|---|---|---|
| JP | 2000-306395 | 11/2000 |
| JP | 2010-54208 | 3/2010 |

OTHER PUBLICATIONS

Notification of Reasons for Rejection issued by the Korean Intellectual Property Office on May 25, 2012, for Korean Patent Application No. 10-2011-22957, and English-language translation thereof.

* cited by examiner

*Primary Examiner* — Yolanda L Wilson
(74) *Attorney, Agent, or Firm* — Finnegan, Henderson, Farabow, Garrett & Dunner, L.L.P.

(57) ABSTRACT

According to one embodiment, a failure analyzing device includes a classifying unit that classifies a failure type in a fail bit map corresponding to each layer, a storage unit that stores a rule to combine failed cells of different layers, and a determining unit that groups a classification result matched with the rule among classification results based on the classifying unit. The rule includes a base point failure, an association failure becoming a combination object of the base point failure, a combination condition defining a relationship between the base point failure and the association failure, and a combination failure name. The determining unit extracts the base point failure from the classification result of one layer, extracts the association failure matched with the combination condition from the classification results of the other layers, groups the extracted base point failure and association failure, and provides the combination failure name.

13 Claims, 14 Drawing Sheets

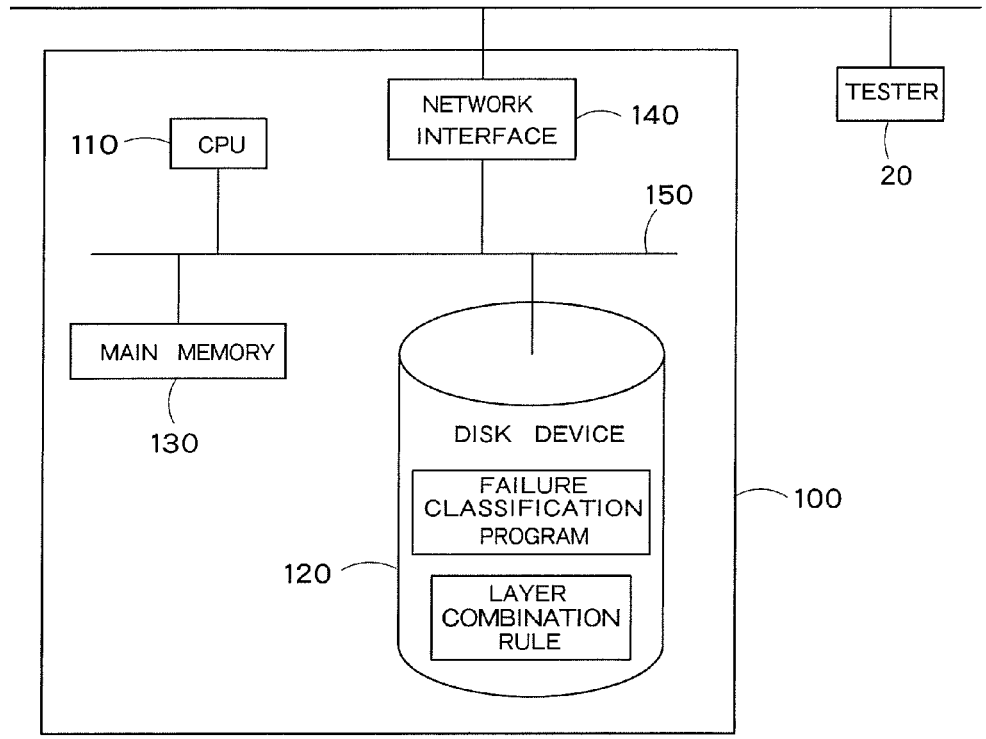
F I G. 1
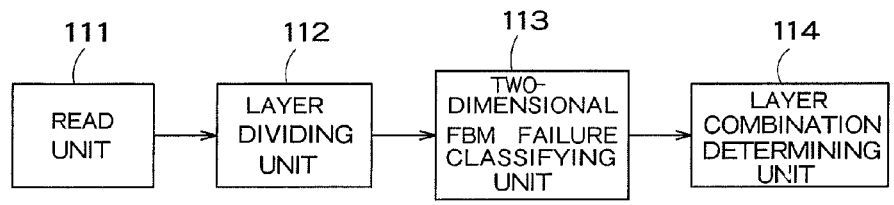
F I G. 2

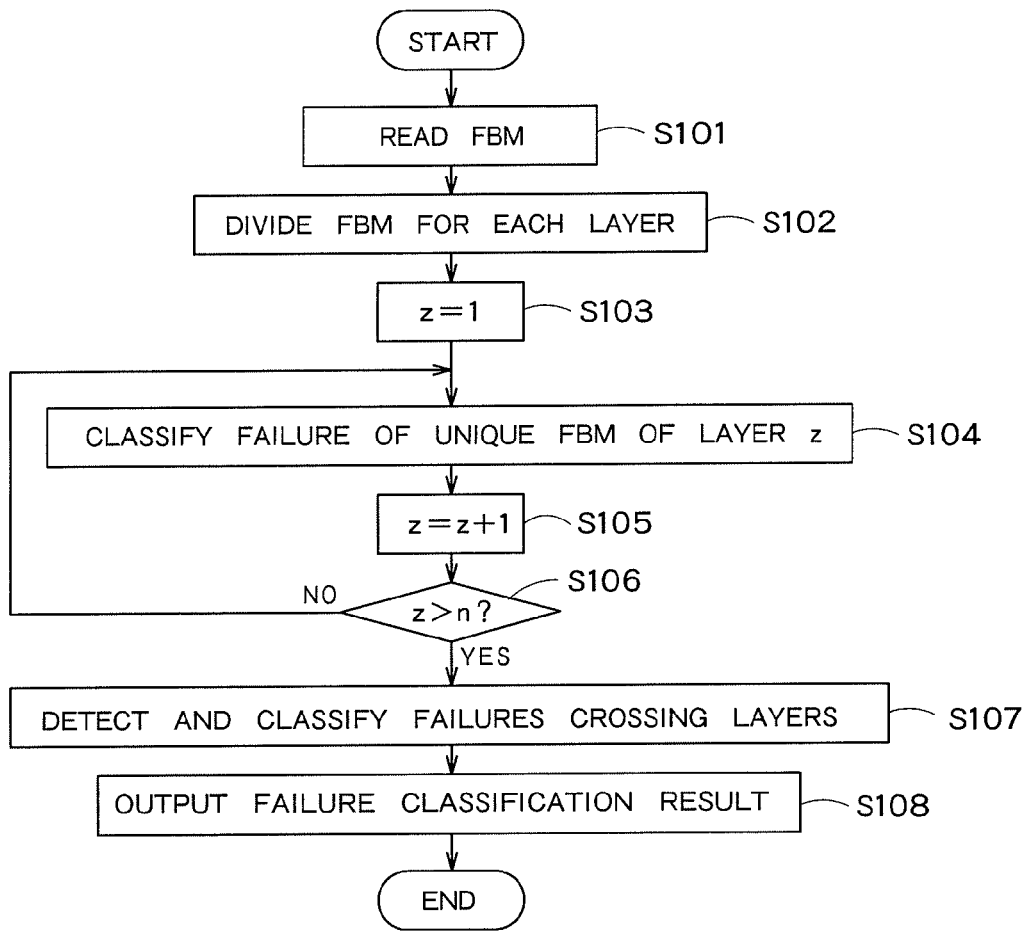
F I G. 3

| RULE NUMBER | BASE POINT FAILURE | COMBINATION CONDITION | ASSOCIATION FAILURE (DELETION FLAG) | ASSOCIATION FAILURE NAME |
|---|---|---|---|---|
| 1 | BIT | INCLUDING SAME COORDINATE (X, Y) OF BASE POINT, AND SEEN IN ALL LAYERS | BIT(D) XLINE YLINE BLOCK | ZLINE |
| 2 | BIT | INCLUDING SAME COORDINATE (X, Y) OF BASE POINT, AND SEEN IN ADJACENT LAYERS | BIT(D) | Z2BIT |
| 3 | Y2BIT | INCLUDING SAME COORDINATES (X, Y–Y+1) OF BASE POINT, AND SEEN IN ALL LAYERS | Z2BIT(D) YLINE BLOCK | YPAIRZLINE |
| 4 | YLINE | INCLUDING SAME COORDINATES (X, Ys–Ye) OF BASE POINT, AND SEEN IN ALL LAYERS | YLINE(D) BLOCK | ZALLYLINE |
| 5 | BLOCK | INCLUDING SAME COORDINATES (Xs–Xe, Ys–Ye) OF BASE POINT, AND SEEN IN ALL LAYERS | BLOCK(D) | ZALLBLOCK |
| 6 | BLOCK | INCLUDING SAME COORDINATES (Xs–Xe, Ys–Ye) OF BASE POINT, AND SEEN IN ADJACENT LAYERS | BLOCK(D) | Z2BLOCK |
| 7 | BIT | INCLUDING SAME COORDINATE (X, Y) OF BASE POINT, SEEN IN 1/2 MORE LAYERS, AND OTHER LAYERS ARE PASS | BIT(D) | PARTIALZLINE |
| ...... | ...... | ...... | ...... | ...... |

F I G. 4

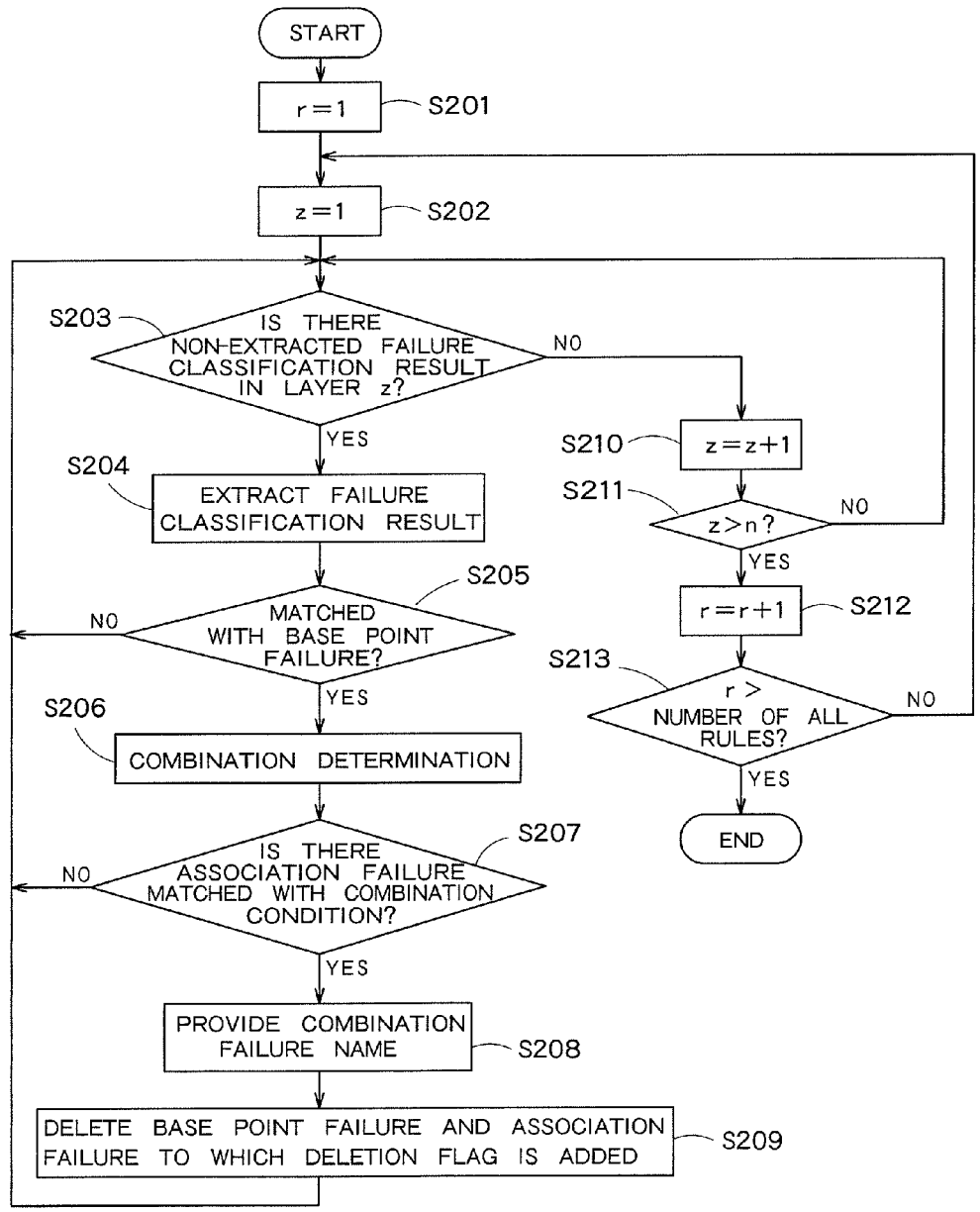
F I G. 5

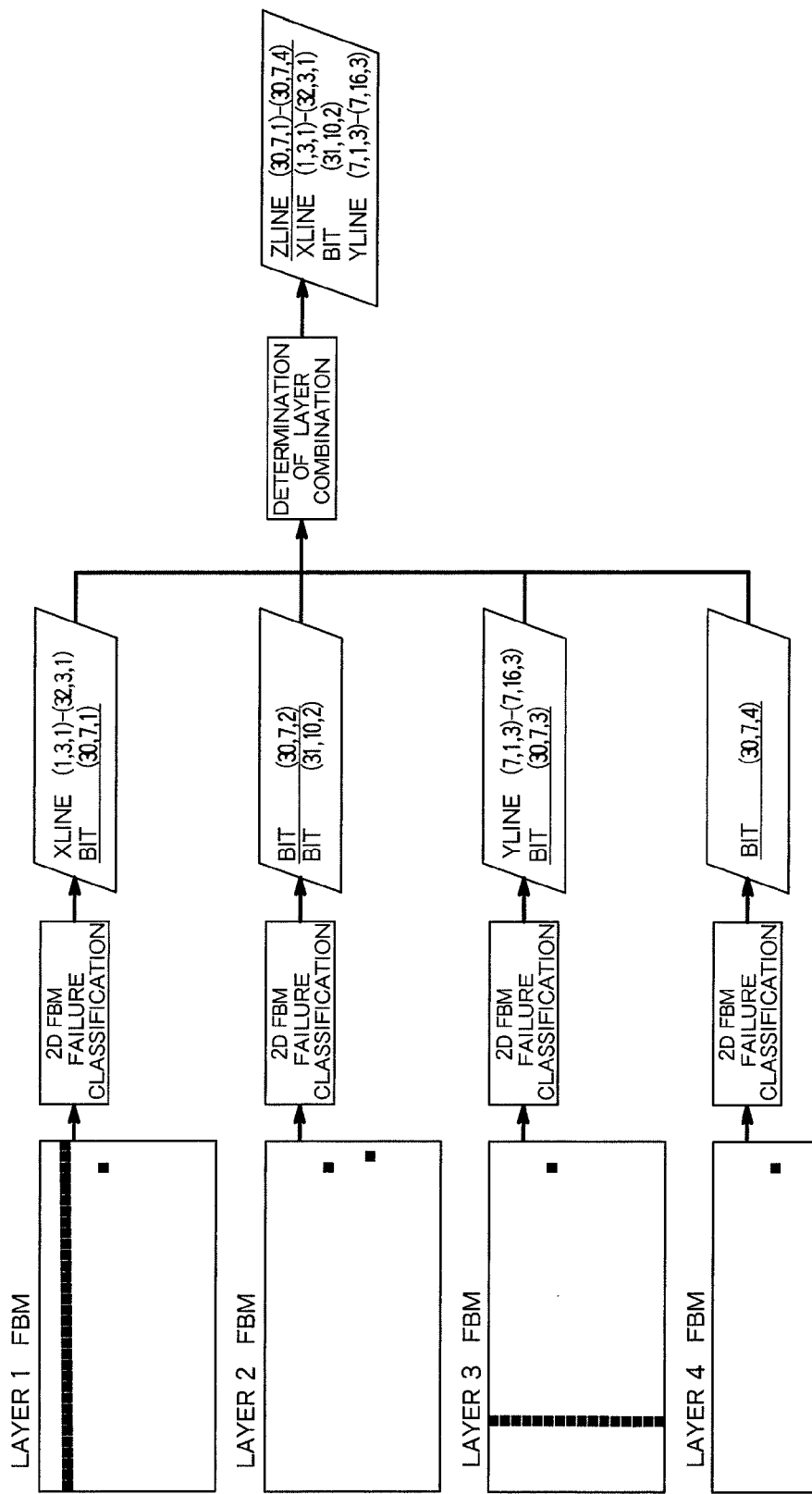
F I G. 6

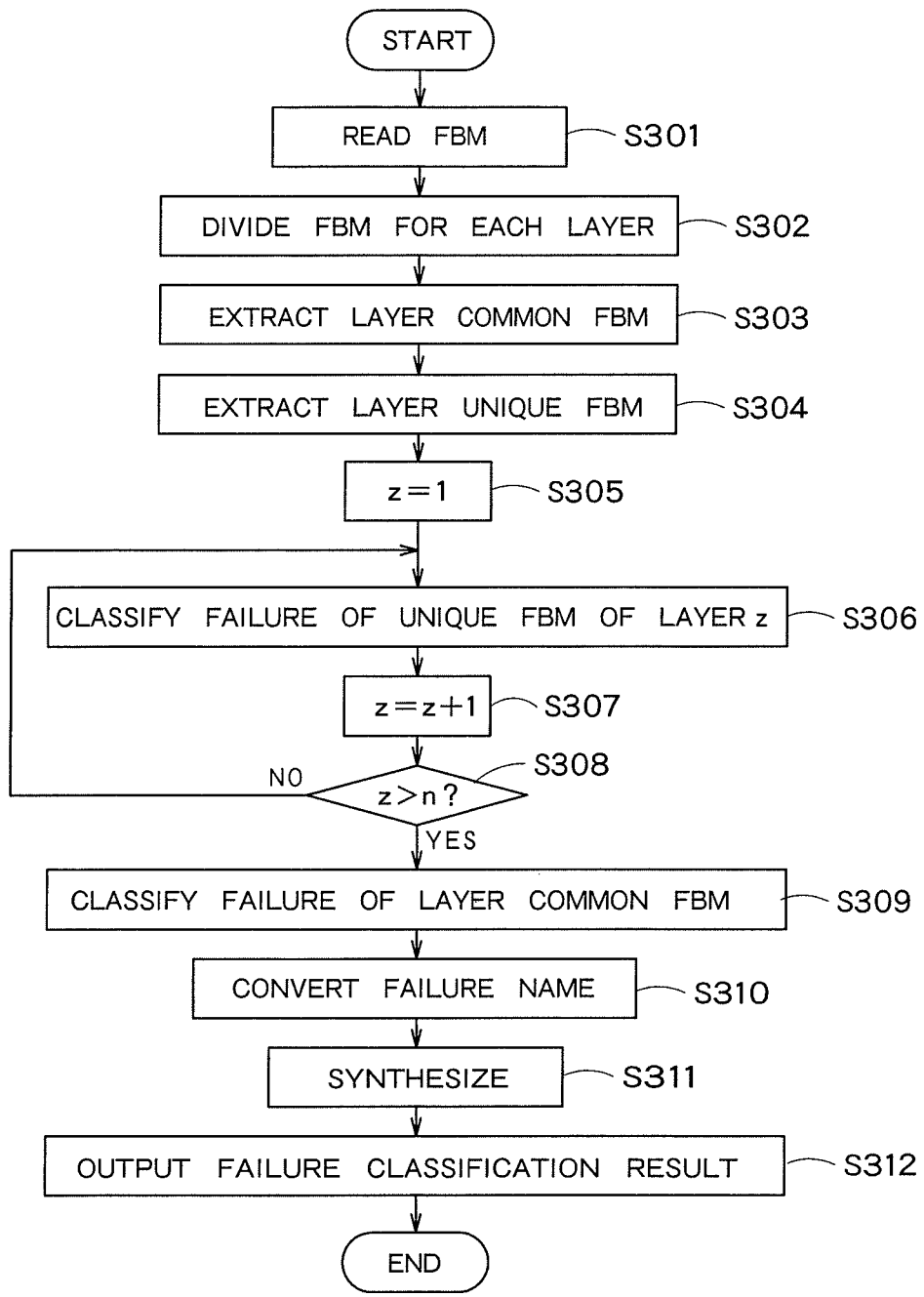
F I G. 9

| TWO-DIMENSIONAL FAILURE CLASSIFICATION NAME | THREE-DIMENSIONAL FAILURE CLASSIFICATION NAME |
|---|---|
| BIT(x,y,z1-z2) | ZLINE(x,y,z1)-(x,y,z2) |
| Y2BIT(x,y1,z1-z2)-(x,y2,z1-z2) | YPAIRZLINE(x,y1,z1)-(x,y2,z2) |
| YLINE(x,y1,z1-z2)-(x,y2,z1-z2) | ZALLYLINE(x,y1,z1)-(x,y2,z2) |
| BLOCK(x1,y1,z1-z2)-(x2,y2,z1-z2) | ZALLBLOCK(x1,y1,z1)-(x2,y2,z2) |
| ⋮ | ⋮ |

F I G. 10

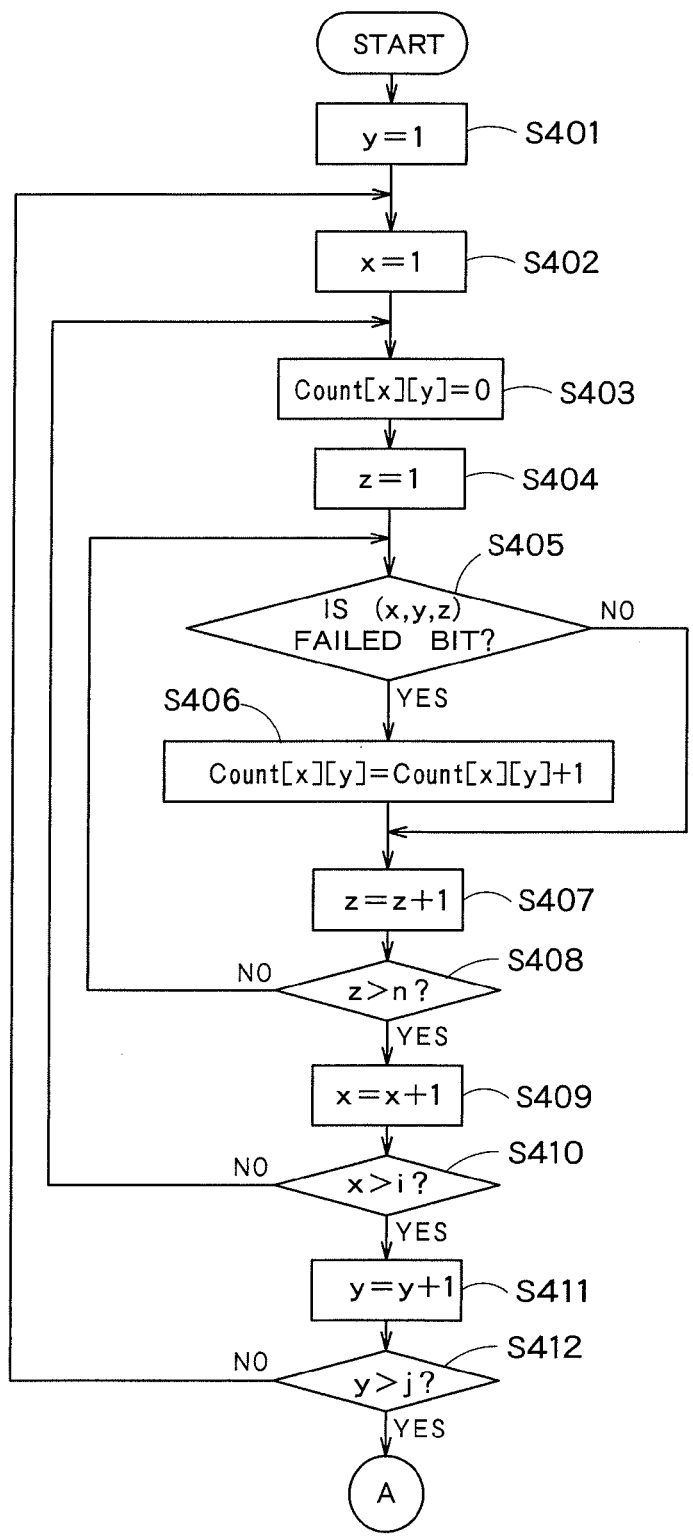
F I G. 11

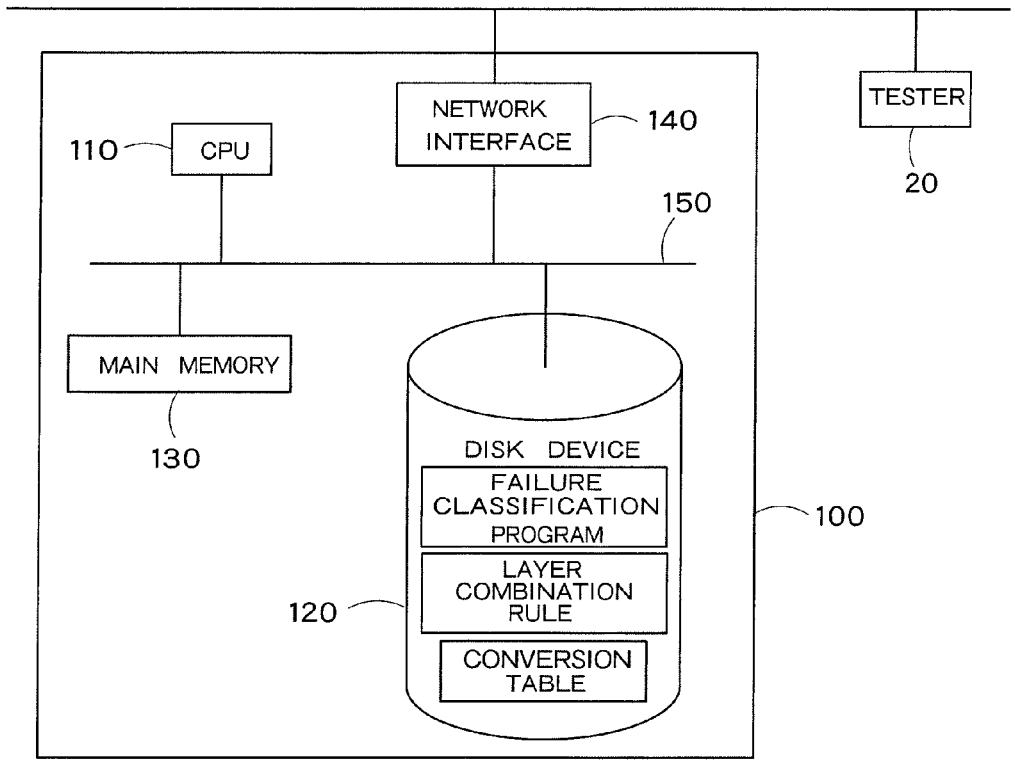
F I G. 14
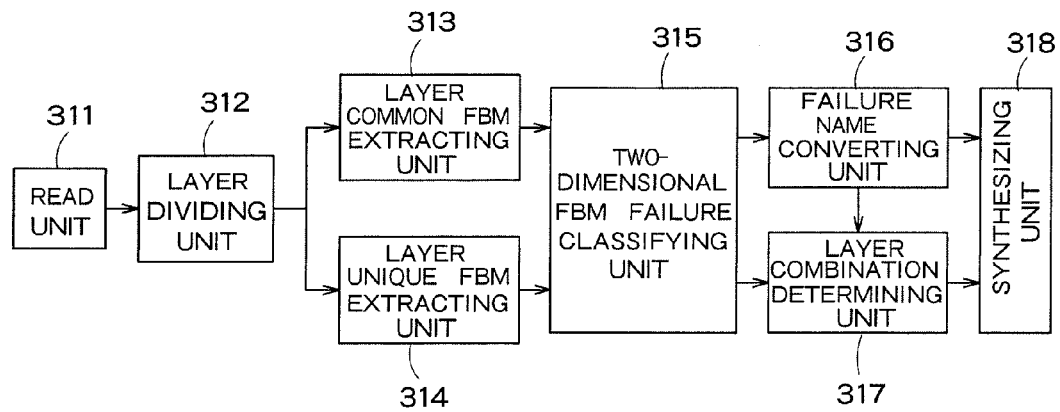
F I G. 15

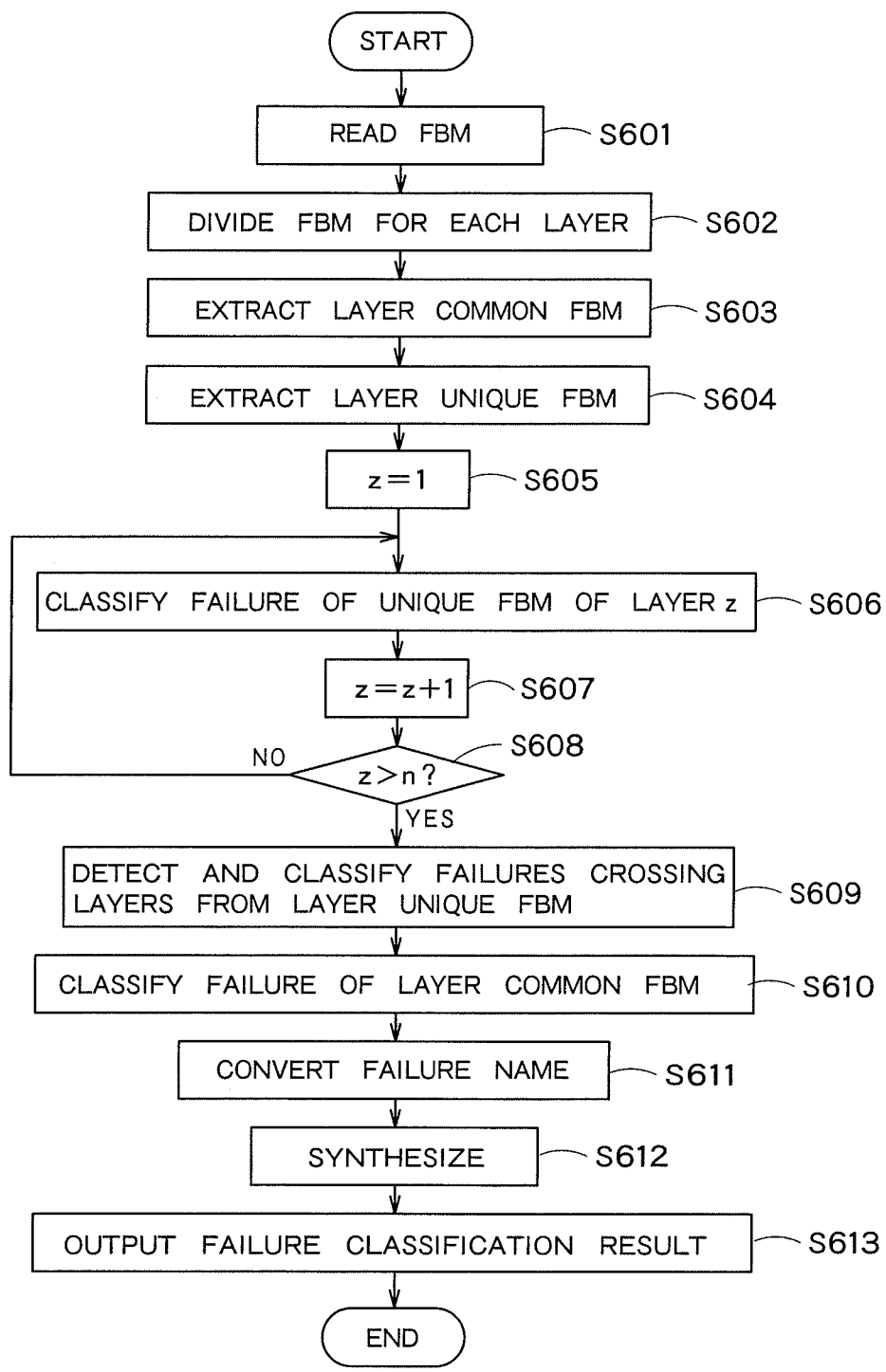
F I G. 16

US 8,479,063 B2

FAILURE ANALYZING DEVICE AND FAILURE ANALYZING METHOD

CROSS REFERENCE TO RELATED APPLICATION

This application is based upon and claims benefit of priority from the Japanese Patent Application No. 2010-175400, filed on Aug. 4, 2010, the entire contents of which are incorporated herein by reference.

FIELD

Embodiments described herein relate generally to a failure analyzing device and a failure analyzing method.

BACKGROUND

A fail bit map (hereinafter, simply referred to as FBM) is used in a failure analyzing method of a semiconductor memory that has plural memory cells. The FBM is used to perform an electric characteristic test with respect to all of the memory cells using a tester and display the test result at the position corresponding to each memory cell.

In the semiconductor memory according to the related art, since the memory cells are disposed on a plane, the FBM is also represented by the two-dimensional coordinates (XY coordinates), and, naturally, a failure classification of the FBM is based on an FBM of a two-dimensional coordinate system. In the failure classification of the FBM of the two-dimensional coordinate system, failures are classified into failure types that are previously defined by information of a positional relationship between the failed cells and the distribution or density of the failed cells.

For example, an independent failure of one bit where there is no failure around the independent failure is classified as "BIT." In the case in which failures are continuous on the same X axis, the failures are classified as "WLINE." In the case in which failures are continuous on the same Y axis, the failures are classified as "BLINE." The other adjacent failures are classified as "OTHER."

In order to reduce the processing time needed for the failure classification of the FBM, the number of failures in a set area is counted, and the failures are classified as "failed area" or "multiple failed bits" according to the number of failures.

In recent years, a semiconductor memory where memory cells are disposed three-dimensionally has been developed. However, in the related art, the failure classification of the FBM is based on the two-dimensional FBM. For this reason, with respect to the three-dimensional memory, the failure types cannot be classified by using the method in which the FBM is divided for each layer into the two-dimensional FBM, the failure classification of the FBM is executed and failures crossing the layers are detected.

BRIEF DESCRIPTION OF THE DRAWINGS

FIG. 1 is a diagram showing the hardware configuration of a failure analyzing device according to a first embodiment;

FIG. 2 is a functional block diagram of the failure analyzing device according to the first embodiment;

FIG. 3 is a flowchart illustrating a failure analyzing method according to the first embodiment;

FIG. 4 is a diagram showing an example of a layer combination rule;

FIG. 5 is a flowchart illustrating a method of detecting failures crossing layers according to the first embodiment;

FIG. 6 is a diagram showing an example of a failure classification according to the first embodiment;

FIG. 9 is a flowchart illustrating a failure analyzing method according to the second embodiment;

FIG. 10 is a diagram showing an example of a conversion table;

FIG. 11 is a flowchart illustrating a method of generating a layer common FBM;

FIG. 14 is a diagram showing the hardware configuration of a failure analyzing device according to a third embodiment;

FIG. 15 is a functional block diagram of the failure analyzing device according to the third embodiment;

FIG. 16 is a flowchart illustrating a failure analyzing method according to the third embodiment.

DETAILED DESCRIPTION

Figure 7:
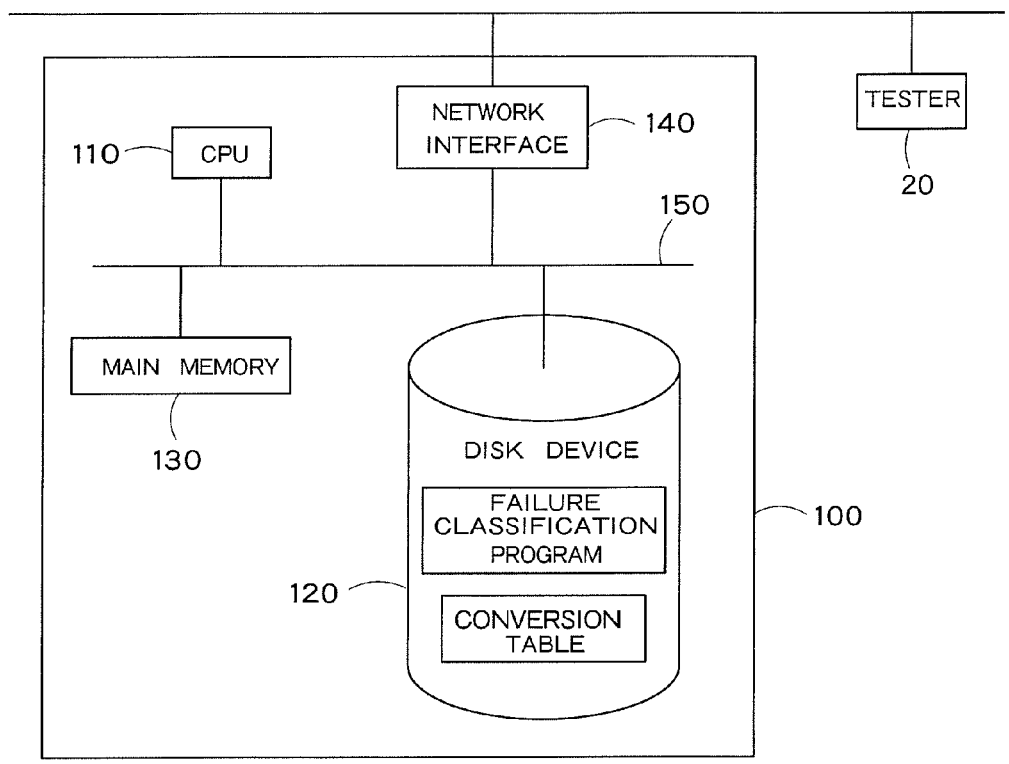
FIG. 7 is a diagram showing the hardware configuration of a failure analyzing device according to a second embodiment.

According to one embodiment, a failure analyzing device comprises a dividing unit that receives a fail bit map where non-failure/failure information of individual cells of a semiconductor memory is arranged in order of physical addresses corresponding to a physical layout of the memory cells, and divides the fail bit map for each layer, a classifying unit that classifies a failure type in the fail bit map corresponding to each layer, a storage unit that stores a rule where the failed cells of different layers are combined as the same failure type, and a determining unit that determines whether classification results based on the classifying unit are matched with the rule and groups the matched classification results. The rule includes a base point failure, an association failure becoming a combination object of the base point failure, a combination condition defining a relationship between the base point failure and the association failure, and a combination failure name. The determining unit extracts the base point failure from the classification result of one layer, extracts the association failure matched with the combination condition from the classification results of the other layers, groups the extracted base point failure and association failure, and provides the combination failure name.

Hereafter, embodiments of the present invention will be described on the basis of the drawings.

(First Embodiment)

FIG. 1 shows the hardware configuration of a failure analyzing device according to a first embodiment of the present invention. A failure analyzing device 100 is connected to the same network as a tester 20, and includes a central processing unit (CPU) 110, a disk device 120, a main memory 130, and a network interface 140. The individual units of the failure analyzing device 100 are connected through a bus 150.

The tester 20 executes an electric characteristic test on each of memory cells of a memory with a three-dimensional structure that becomes a failure analysis object, and outputs a fail bit map (hereinafter, simply referred to as FBM) including the test result (non-failure/failure information of the memory cells) to the failure analyzing device 100 through the network. The FBM that is output by the tester 20 is converted into an FBM where the test result is arranged in order of physical addresses corresponding to a physical layout of the memory cells, by a physical FBM conversion program independent from this embodiment. The memory with the three-dimensional structure has n layers (n is an integer of 2 or more) in a height direction.

The disk device 120 stores a failure classification program that is executed by the CPU 110. The disk device 120 stores a layer combination rule that is used when failures crossing layers are detected. The disk device 120 is, for example, a hard disk. The failure classification program may be stored in a ROM or a magnetic tape (not shown in the drawings), instead of the disk device 120.

The CPU 110 loads the failure classification program in the disk device 120 to the main memory 130 and executes the failure classification program. At this time, the layer combination rule in the disk device 120 may be loaded to the main memory 130. With the execution of the failure classification program, an area where FBMs (FBM of a layer 1, FBM of a layer 2, . . . , and FBM of a layer n) of the individual layers are stored and an area where failure classification results of the individual layers (failure classification result of the layer 1, failure classification result of the layer 2, . . . , and failure classification result of the layer n) are stored are secured on the main memory 130. The layer 1 means a layer where the Z (height direction) coordinates are 1. Likewise, the layer 2, . . . , and the layer n mean layers where the Z coordinates are 2, . . . , and n.

FIG. 2 is a functional block diagram that is realized by executing the failure classification program by the CPU 110. By executing the failure classification program, a read unit 111, a layer dividing unit 112, a two-dimensional FBM failure classifying unit 113, and a layer combination determining unit 114 are realized.

The process that is executed in the read unit 111, the layer dividing unit 112, the two-dimensional FBM failure classifying unit 113, and the layer combination determining unit 114 will be described together with a flowchart of FIG. 3.

(Step S101) The read unit 111 reads the FBM on the disk device 120.

(Step S102) The layer dividing unit 112 divides the FBM to correspond to each layer. The FBMs of the individual layers (FBM of the layer 1, FBM of the layer 2, . . . , and FBM of the layer n) is stored in the main memory 130. The FBM of each layer is represented by the two-dimensional coordinates (XY coordinates).

(Step S103) A variable z is set to be 1.

(Step S104) The two-dimensional FBM failure classifying unit 113 classifies a failure type with respect to the FBM of the layer z. The classification of the failure type that is executed herein is a failure classification based on the known two-dimensional coordinate system FBM. For example, an independent failure of one bit where there is no failure around the corresponding failure is classified as "BIT," a failure where two failed bits are continuous on the Y axis and other failures exist around the corresponding failure is classified as "Y2BIT," a failure where failed bits are continuous on the X axis is classified as "XLINE," a failure where failed bits are continuous on the same Y axis is classified as "YLINE," and a failure where fail bits are collected in a rectangular shape is classified as "BLOCK."

The failure classification result of the FBM of the layer z (layer z failure classification result) is stored in the main memory 130.

(Step S105) The variable z is increased by 1.

(Step S106) When z is larger than n, the process proceeds to step S107. When z is equal to or smaller than n, the process returns to step S104.

(Step S107) The layer combination determining unit 114 refers to the layer combination rule, detects failures crossing the layers from the failure classification results for the individual layers (layer 1 failure classification result to layer n failure classification result), and classifies the failure types.

(Step S108) The failure classification results that include the classification results in step S107 and are stored in the main memory 130 are output to the disk device 120.

FIG. 4 shows an example of the layer combination rule. The layer combination rule includes a base point failure, a combination condition, an association failure (deletion flag), and a combination failure name.

The "base point failure" is a failure that becomes a base point where a layer combination determination (determination on whether the failures are combined as failures crossing the layers) is performed.

The "combination condition" is a condition that indicates a relationship between the above-described base point and the association failure to be described below. When the condition is satisfied, the base point failure and the association failure are collected and a combination failure name to be described below is newly added.

The "association failure" is a failure that is combined with the above-described base point failure and plural types can be designated. The deletion flag that is added to the back of the association failure indicates whether the association failure is deleted, when the combination condition is satisfied and the failure becomes a new combination failure.

A method that detects the failures crossing the layers and classifies the failure types will be described using the flowchart of FIG. 5.

(Step S201) A variable r is set to be 1.

(Step S202) A variable z is set to be 1.

(Step S203) When the non-extracted failure classification result exists from the failure classification result of the FBM of the layer z stored in the main memory 130 in step S104, the process proceeds to step S204. When the non-extracted failure classification result does not exist, the process proceeds to step S210.

(Step S204) One non-extracted failure classification result is extracted.

(Step S205) It is confirmed whether the failure classification result extracted in step S204 is the same as the base point failure of a rule number r of the layer combination rule. When the failure classification result is the same as the base point failure, the process proceeds to step S206. When the failure classification result is different from the base point failure, the process returns to step S203.

(Step S206) The combination determination is performed using the combination condition corresponding to the rule number r of the layer combination rule. Specifically, it is determined whether the association failure satisfying the combination condition exists.

(Step S207) When the association failure matched with the combination condition exists, the process proceeds to step S208. When the association failure matched with the combination condition does not exist, the process returns to step S203.

(Step S208) The failure classification result (base point failure confirmed in step S205) extracted in step S204 and the association failure are grouped, the combination failure name corresponding to the rule number r is added as a new failure, and the new failure is stored in the main memory 130.

(Step S209) The failure classification result (base point failure confirmed in step S205) extracted in step S204 and the association failure to which the deletion flag is added are deleted.

(Step S210) The variable z is increased by 1.

(Step S211) When the variable z is larger than n, the process proceeds to step S212. When the variable z is equal to or smaller than n, the process returns to step S203.

(Step S212) The variable r is increased by 1.

(Step S213) When the variable r is larger than the number of all rules, the process ends. When the variable r is equal to or smaller than the number of all rules, the process returns to step S202. Thereby, the layer combination determination can be performed while all the rules are sequentially referred to.

An example of the detection of the failures crossing the layers and the classification of the failure types will be described using FIG. 6. For simplification of description, it is assumed that the FBM is divided into four layers (layer 1, layer 2, layer 3, and layer 4).

The failures of the FBMs (layer 1 FBM, layer 2 FBM, layer 3 FBM, and layer 4 FBM) that are divided by the layer dividing unit 112 for each layer are (two-dimensionally) classified by the two-dimensional FBM failure classifying unit 113.

In FIG. 6, the failure classification result of the layer 1 FBM becomes XLINE (1, 3, 1)-(32, 3, 1) and BIT (30, 7, 1).

The classified failures are represented by the following two patterns. The pattern "1" is used when failures of linear, planar, and cubic shapes are represented and indicates the coordinates of a starting point of the failures and the coordinates of an ending point of the failures. The pattern "2" is used when the failures of a dotted shape are represented and the coordinates indicate the position of the point failure.

Pattern "1": failure name (X coordinates, Y coordinates, Z coordinates)-(X coordinates, Y coordinates, Z coordinates)

Pattern "2": failure name (X coordinates, Y coordinates, Z coordinates)

Therefore, in the layer 1, the XLINE failure of the starting end coordinates (1, 3, 1) and the ending point coordinates (32, 3, 1) exists and the BIT failure exists at the position of the coordinates (30, 7, 1).

The failure classification result of the layer 2 FBM is BIT (30, 7, 2) and BIT (31, 10, 2). Therefore, in the layer 2, the BIT failures exist at the position of the coordinates (30, 7, 2) and the position of the coordinates (31, 10, 2).

The failure classification result of the layer 3 FBM is YLINE (7, 1, 3)-(7, 16, 3) and BIT (30, 7, 3). Therefore, in the layer 3, the YLINE failure of the starting point coordinates (7, 1, 3) and the position of the ending point coordinates (7, 16, 3) exists and the BIT failure exists at the position of the coordinates (30, 7, 3).

The failure classification result of the layer 4 FBM is BIT (30, 7, 4). Therefore, in the layer 4, the BIT failure exists at the position of the coordinates (30, 7, 4).

Next, the layer combination determining unit 114 refers to the layer combination rule, detects failures crossing the layers from the layer 1 FBM, the layer 2 FBM, the layer 3 FBM, and the layer 4 FBM, and classifies the failure types.

First, the layer 1 is considered. Since the XLINE (1, 3, 1)-(32, 3, 1) of the layer 1 does not correspond to the base point failure of the combination rule, this is excluded from a combination failure object.

The BIT (30, 7, 1) of the layer 1 corresponds to the base point failure of the rule number 1, and the BIT (30, 7, 2) of the layer 2, the BIT (30, 7, 3) of the layer 3, and the BIT (30, 7, 4) of the layer 4 that correspond to the association failure are matched with the combination condition. For this reason, these are grouped, are newly added with a combination failure name, and are classified as the ZLINE (30, 7, 1)-(30, 7, 4). The BIT (30, 7, 1) of the base point failure and BIT (30, 7, 2), BIT (30, 7, 3), and BIT (30, 7, 4) of the association failures where the deletion flag is fixed are deleted.

Since there is no failure in the layer 1, the next layer 2 is considered.

Since BIT (30, 7, 2) is deleted as described above, this is excluded from a combination failure object. BIT (31, 10, 2) corresponds to the base point failures of the rule number 1, the rule number 2, and the rule number 7. However, the association failure matched with the combination condition does not exist and this is excluded from a combination failure object.

Since there is no failure in the layer 2, the next layer 3 is considered.

YLINE (7, 1, 3)-(7, 16, 3) corresponds to the rule number 4. However, the association failure matched with the combination condition does not exist and this is excluded from a combination failure object. Since BIT (30, 7, 3) is deleted as described above, this is excluded from a combination failure object.

Since there is no failure in the layer 3, the final layer 4 is considered.

Since BIT (30, 7, 4) is deleted as described above, this is excluded from a combination failure object.

In this way, the (final) failure classification result that is output from the layer combination determining unit 114 includes ZLINE (30, 7, 1)-(30, 7, 4), XLINE (1, 3, 1)-(32, 3, 1), BIT (31, 10, 2), and YLINE (7, 1, 3)-(7, 16, 3). The failure classification result is stored in the disk device 120.

As such, according to this embodiment, after the two-dimensional FBM failure classification is performed with respect to each layer, while the layer combination rule is referred to, the failures crossing the layers can be detected and the failure types can be classified.

For this reason, the FBM failure classification is enabled with respect to the semiconductor memory where the memory cells are disposed three-dimensionally, failure analysis efficiency can be improved, and a product development period can be decreased.

(Second Embodiment)

FIG. 7 shows the hardware configuration of a failure analyzing device according to a second embodiment of the present invention. The same components as those of the first embodiment shown in FIG. 1 are denoted by the same reference numerals and the description thereof will not be repeated. The second embodiment is different from the first embodiment shown in FIG. 1 in that the disk device 120 stores a conversion table (to be described below), instead of the layer combination rule. Further, the second embodiment is different from the first embodiment in a functional block realized by executing the failure classification program by the CPU 110.

Figure 8:
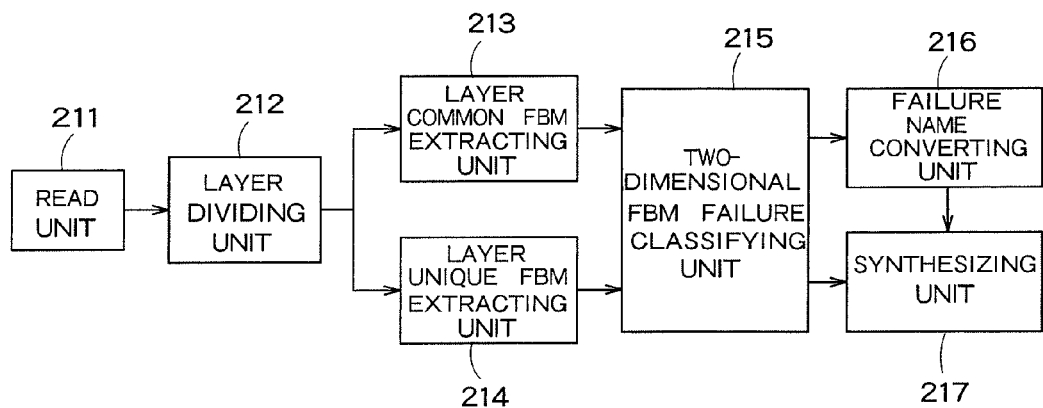
FIG. 8 is a functional block diagram of the failure analyzing device according to the second embodiment.

FIG. 8 is a functional block diagram that is realized by executing the failure classification program according to this embodiment by the CPU 110. By executing the failure classification program, a read unit 211, a layer dividing unit 212, a layer common FBM extracting unit 213, a layer unique FBM extracting unit 214, a two-dimensional FBM failure classifying unit 215, a failure name converting unit 216, and a synthesizing unit 217 are realized.

With the execution of the failure classification program, an area where unique FBMs (unique FBM of a layer 1, unique FBM of a layer 2, . . . , and unique FBM of a layer n) of individual layers are stored and an area where a layer common FBM indicating a failure common to all layers (layers of the predetermined number or more), failure classification results based on the unique FBMs of the individual layers (failure classification result of the layer 1, failure classification result of the layer 2, . . . , and failure classification result of the layer n), and a failure classification result based on the layer common FBM (layer common failure classification result) are stored are secured on the main memory 130.

The disk device 120 stores a conversion table that is used when the failure name converting unit 216 converts a failure name. The contents of the conversion table are described below. The conversion table may be loaded to the main memory 130 with the execution of the failure classification program.

The process that is executed in the read unit 211, the layer dividing unit 212, the layer common FBM extracting unit 213, the layer unique FBM extracting unit 214, the two-dimensional FBM failure classifying unit 215, the failure name converting unit 216, and the synthesizing unit 217 will be described together with a flowchart of FIG. 9.

(Step S301) The read unit 211 reads the FBM on the disk device 120.

(Step S302) The layer dividing unit 212 divides the FBM to correspond to each layer.

(Step S303) The layer common FBM extracting unit 213 extracts the failure that is common to all the layers (or layers of the predetermined number or more) and stores the extracted failure as the layer common FBM in the main memory 130.

(Step S304) The layer unique FBM extracting unit 214 extracts the unique failures of the individual layers and stores the unique failures of the individual layers as the unique FBMs of the individual layers (unique FBM of the layer 1, unique FBM of the layer 2, . . . , and unique FBM of the layer n) in the main memory 130. The unique failures of the individual layers correspond to the unique failures other than the failure extracted by the layer common FBM extracting unit 213 in step S303.

(Step S305) A variable z is set to be 1.

(Step S306) The two-dimensional FBM failure classifying unit 215 performs the failure classification with respect to the unique FBM of the layer z. The failure classification that is executed herein is a failure classification based on the known two-dimensional coordinate system FBM. For example, an independent failure of one bit where there is no failure around the corresponding failure is classified as "BIT," a failure where failed bits are continuous on the X axis is classified as "XLINE," a failure where failed bits are continuous on the same Y axis is classified as "YLINE," and a failure where fail bits are collected in a rectangular shape is classified as "BLOCK."

The failure classification result of the FBM of the layer z (layer z failure classification result) is stored in the main memory 130.

(Step S307) The variable z is increased by 1.

(Step S308) When z is larger than n, the process proceeds to step S309. When z is equal to or smaller than n, the process returns to step S306.

By repeating steps S306 to S308, the failure classification is performed with respect to the unique FBMs of all of the layers.

(Step S309) The two-dimensional FBM failure classifying unit 215 performs the failure classification with respect to the layer common FBM. In this case, the failure classification is also a failure classification based on the known two-dimensional coordinate system FBM, similar to step S306.

(Step S310) The failure name converting unit 216 refers to the conversion table to convert the two-dimensional failure classification name based on the failure classification in step S309 into a three-dimensional failure classification name. In the conversion table, as shown in FIG. 10, a relationship between the failure name (two-dimensional failure classification name) in the layer common FBM and the three-dimensional failure classification name is defined.

For example, the FBM where the failure exists in all of the layers is defined as the layer common FBM. When the BIT failure exists in the layer common FBM, in actuality, the failure exists at the same position as the BIT failure in all of the layers from the layer 1 to the layer n. That is, this is "ZLINE" where the failed bits are continuous. The failure name converting unit 216 converts BIT into ZLINE.

The failure name converting unit 216 converts the failure name and stores the layer common failure classification result in the main memory 130.

(Step S311) The synthesizing unit 217 synthesizes the failure classification results (failure classification result of the layer 1, failure classification result of the layer 2, . . . , and failure classification result of the layer n) based on the unique FBMs of the individual layers, which are stored in the main memory 130, and the layer common failure classification result.

(Step S312) The failure classification result that is synthesized in step S311 is output to the disk device 120 and is stored.

An example of a process of generating the layer common FBM in step S303 will be described using a flowchart of FIGS. 11 and 12. In each layer, the X coordinates are 1 to i (i is an integer of 2 or more), the Y coordinates are 1 to j (j is an integer of 2 or more), and memory cells having i×j bits are provided. The number of layers is n.

(Step S401) A variable y is set to be 1.

(Step S402) A variable x is set to be 1.

(Step S403) A variable Count [x] [y] is set to be 0. This Count [x] [y] indicates a count value of failed bits of a Z direction at the position of (X coordinates, Y coordinates)=(x, y).

(Step S404) A variable z is set to be 1.

(Step S405) When the coordinates (x, y, z) of the FBM are failed bits, the process proceeds to step S406. When the coordinates (x, y, z) of the FBM are not failed bits, the process proceeds to step S407.

(Step S406) The variable Count [x] [y] is increased by 1.

(Step S407) The variable z is increased by 1.

(Step S408) When the variable z is larger than n, the process proceeds to step S409. When the variable z is equal to or smaller than n, the process proceeds to step S405.

By repeating steps S405 to S408, the number of failed bits of the Z direction at the coordinates (x, y) can be calculated.

(Step S409) The variable x is increased by 1

(Step S410) When the variable x is larger than i, the process proceeds to step S411. When the variable x is equal to or smaller than i, the process proceeds to step S403.

By repeating steps S403 to S410, all of 1 to i can be sequentially set to the variable x.

(Step S411) The variable y is increased by 1.

Figure 12:
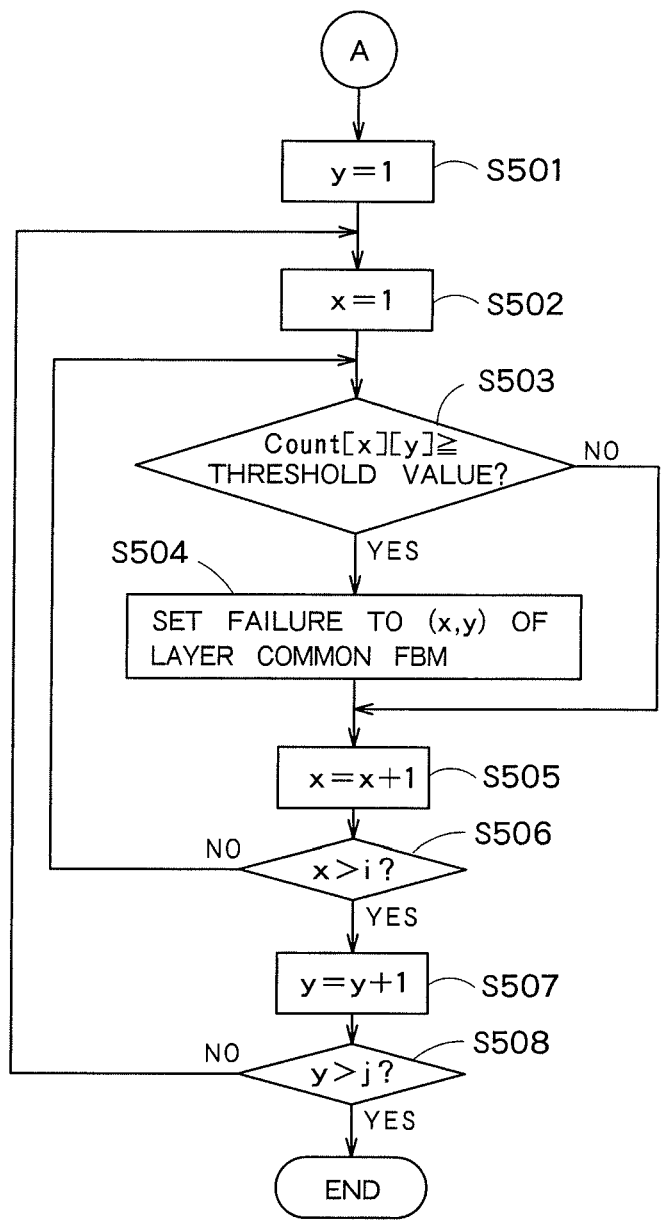
FIG. 12 is a flowchart illustrating a method of generating a layer common FBM.

(Step S412) When the variable y is larger than j, the process proceeds to step S501 of FIG. 12. When the variable y is equal to or smaller than j, the process proceeds to step S402.

By repeating steps S402 to S412, the variable y can be sequentially set to be all of 1 to j.

Therefore, the number of failed bits of the Z direction at all the coordinates on the XY plane can be calculated.

(Step S501) A variable y is set to be 1.

(Step S502) A variable x is set to be 1.

(Step S503) When the Count [x] [y] is equal to or larger than the predetermined threshold value, the process proceeds to step S504. When the Count [x] [y] is smaller than the predetermined threshold value, the process proceeds to step S505.

(Step S504) The failure is set to the coordinates (x, y) of the layer common FBM.

(Step S505) The variable x is increased by 1.

(Step S506) When the variable x is larger than i, the process proceeds to step S507. When the variable x is equal to or smaller than i, the process proceeds to step S503.

(Step S507) The variable y is increased by 1.

(Step S508) When the variable y is larger than j, the process ends. When the variable y is equal to or smaller than j, the process returns to step S502.

Thereby, the layer common FBM where the failure is set to the position at which the number of failed bits of the Z direction is equal to or larger than the threshold value is generated. The threshold value in step S503 is changed by the definition of the layer common FBM. For example, when the FBM where the failures exist in all of the layers is defined as the layer common FBM, the number n of all of the layers may be given to the threshold value in step S503. When the FBM where the failures exist in the layers of the half number is defined as the layer common FBM, the number n/2 may be given to the threshold value in step S503.

The type of layer common FBM is not limited to one. For example, two types of layer common FBMs, that is, a layer common FBM1 where the failure exist in all of the layers and a layer common FBM2 where the failure exist in the layer of the half number may be used.

The flowcharts of FIGS. 11 and 12 illustrate the processing contents and become different flowcharts in actual mounting considering performance.

The method of extracting the layer common FBM is not limited thereto. For example, when the FBM where the failures exist in all of the layers is defined as the layer common FBM, the layer common FBM may be generated by calculating logical multiplication of the FBMs of all of the layers.

The layer common failure classification result based on the layer common FBM generated in the above-described way and the failure classification results (layer 1 failure classification result, layer 2 failure classification result, . . . , and layer n failure classification result) based on the unique FBMs of the individual layers are synthesized with each other, and the detection of the failures crossing the layers and the classification of the failure types can be performed.

An example of the detection of the failures crossing the layers and the classification of the failure types according to this embodiment will be described using FIG. 13. For simplification of description, it is assumed that the FBM is divided into four layers (layer 1, layer 2, layer 3, and layer 4).

Figure 13:
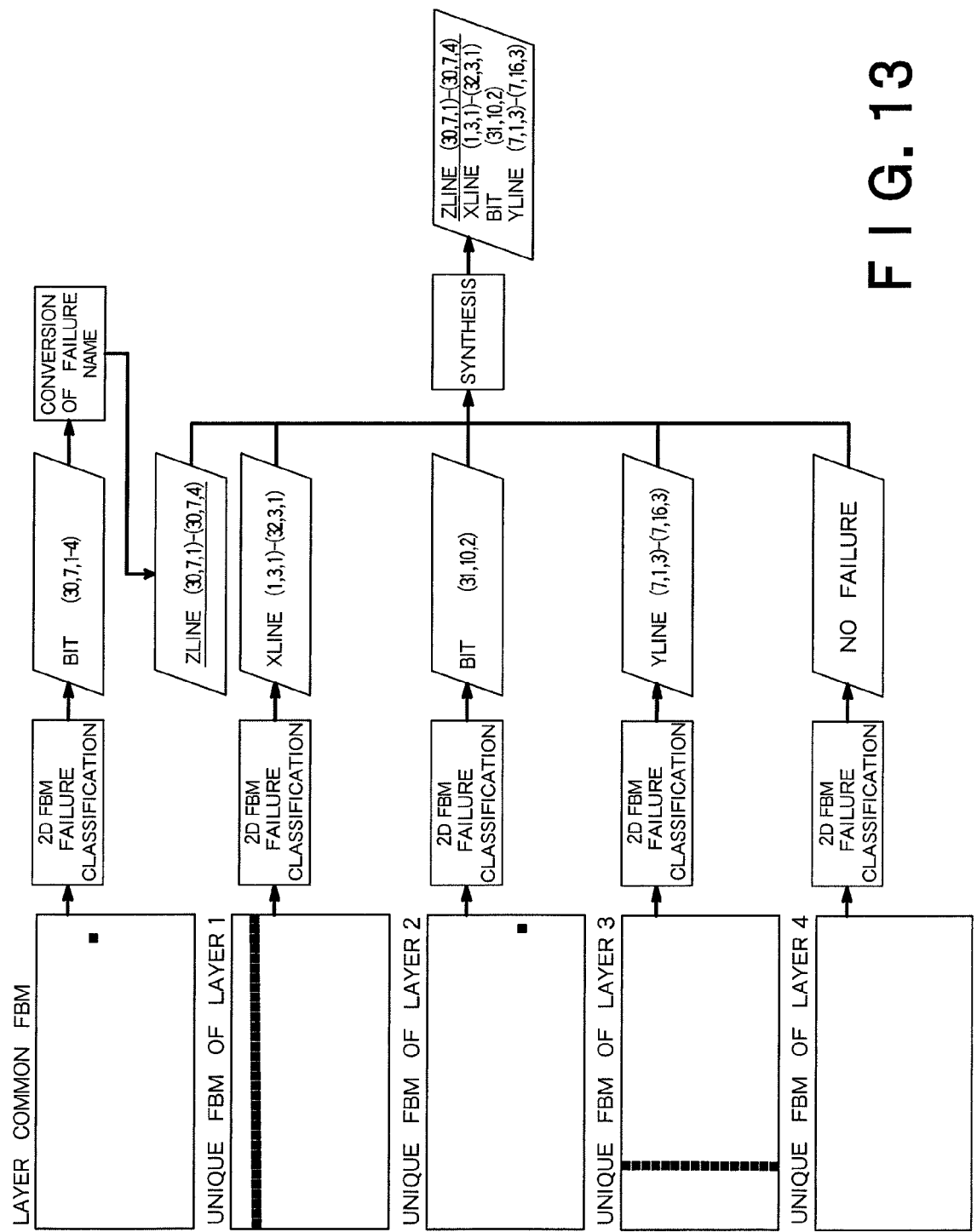
FIG. 13 is a diagram showing an example of a failure classification according to the second embodiment.

The layer common FBM extracting unit 213 extracts the layer common FBM shown in FIG. 13 from the FBMs divided for each layer. The layer unique FBM extracting unit 214 extracts the unique failures of the individual layers (layer 1 unique FBM, layer 2 unique FBM, . . . , and layer n unique FBM) from the FBMs divided for each layer.

The two-dimensional FBM failure classifying unit 215 classifies the failures of the layer common FBM and the unique FBM of each layer.

The failure classification result of the layer common FBM is one of BIT (30, 7, 1-4). The failure name converting unit 216 refers to the conversion table shown in FIG. 10 and converts the failure name from BIT (30, 7, 1-4) to ZLINE (30, 7, 1)-(30, 7, 4).

The failure classification result of the unique FBM of the layer 1 is one of XLINE (1, 3, 1)-(32, 3, 1).

The failure classification result of the unique FBM of the layer 2 is one of BIT (31, 10, 2).

The failure classification result of the unique FBM of the layer 3 is one of YLINE (7, 1, 3)-(7, 16, 3).

The failure does not exist in the unique FBM of the layer 4.

The synthesizing unit 217 synthesizes the failure classification results and outputs the synthesized results as a (final) failure classification result including ZLINE (30, 7, 1)-(30, 7, 4), XLINE (1, 3, 1)-(32, 3, 1), BIT (31, 10, 2), and YLINE (7, 1, 3)-(7, 16, 3). The failure classification result that is output from the synthesizing unit 217 is stored in the disk device 120.

As such, in this embodiment, the FBM failure classification result that is obtained by converting the name of the FBM failure classification result is synthesized with the two-dimensional FBM failure classification result of the unique FBM of each layer. Thereby, failures crossing the layers can be detected and the failure of the three-dimensional FBM can be classified.

For this reason, the FBM failure classification is enabled with respect to the semiconductor memory where the memory cells are disposed three-dimensionally, failure analysis efficiency can be improved, and a product development period can be decreased.

In this embodiment, the layer combination rule is not collated with each of all of the failures of all of the layers as in the first embodiment. Therefore, as compared with the first embodiment, the processing time can be shortened.

(Third Embodiment)

FIG. 14 shows the hardware configuration of a failure analyzing device according to a third embodiment of the present invention. The same components as those of the first embodiment shown in FIG. 1 are denoted by the same reference numerals and the description thereof will not be repeated. The third embodiment is different from the first embodiment shown in FIG. 1 in that the disk device 120 stores the conversion table described in the second embodiment. Further, the third embodiment is different from the first embodiment in a functional block realized by executing the failure classification program by the CPU 110.

FIG. 15 is a functional block diagram that is realized by executing the failure classification program according to this embodiment by the CPU 110. By executing the failure classification program, a read unit 311, a layer dividing unit 312, a layer common FBM extracting unit 313, a layer unique FBM extracting unit 314, a two-dimensional FBM failure classifying unit 315, a failure name converting unit 316, a layer combination determining unit 317, and a synthesizing unit 318 are realized.

This embodiment is obtained by combining the first embodiment and the second embodiment. The read unit 311, the layer dividing unit 312, and the two-dimensional FBM failure classifying unit 315 correspond to the read units 111 and 211, the layer dividing units 112 and 212, and the two-dimensional FBM failure classifying units 113 and 215. The layer common FBM extracting unit 313, the layer unique FBM extracting unit 314, and the failure name converting unit 316 correspond to the layer common FBM extracting unit 213, the layer unique FBM extracting unit 214, and the failure name converting unit 216 in the second embodiment.

The layer combination determining unit 317 executes the same process as the layer combination determining unit 114 in the first embodiment. The layer combination determining unit 317 refers to the layer combination rule shown in FIG. 4, detects the failures crossing the layers from the failure classification result of the unique FBM of each layer, and classifies the failure type.

The synthesizing unit 318 executes the same process as the synthesizing unit 217 in the second embodiment and synthesizes the failure classification result output from the layer combination determining unit 317 and the layer common failure classification result output from the failure name converting unit 316.

With the execution of the failure classification program, an area where unique FBMs (unique FBM of a layer 1, unique FBM of a layer 2, . . . , and unique FBM of a layer n) of individual layers are stored and an area where a layer common FBM indicating a failure common to all layers (layers of the predetermined number or more), failure classification results based on the unique FBMs of the individual layers (failure classification result of the layer 1, failure classification result of the layer 2, . . . , and failure classification result of the layer n), and a failure classification result based on the layer common FBM (layer common failure classification result) are stored are secured on the main memory 130. The disk device 120 stores the layer combination rule and the conversion table.

The process that is executed in the read unit 311, the layer dividing unit 312, the layer common FBM extracting unit 313, the layer unique FBM extracting unit 314, the two-dimensional FBM failure classifying unit 315, the failure name converting unit 316, the layer combination determining unit 317, and the synthesizing unit 318 will be described together with a flowchart of FIG. 16.

(Step S601) The read unit 311 reads the FBM on the disk device 120.

(Step S602) The layer dividing unit 312 divides the FBM to correspond to each layer.

(Step S603) The layer common FBM extracting unit 313 extracts the failure that is common to all the layers (or layers of the predetermined number or more) and stores the extracted failure as the layer common FBM in the main memory 130. The layer common FBM is generated by the same method as the second embodiment (refer to FIGS. 11 and 12).

(Step S604) The layer unique FBM extracting unit 314 extracts the unique failures of the individual layers and stores the unique failures of the individual layers as the unique FBMs of the individual layers (unique FBM of the layer 1, unique FBM of the layer 2, . . . , and unique FBM of the layer n) in the main memory 130.

(Step S605) A variable z is set to be 1.

(Step S606) The two-dimensional FBM failure classifying unit 315 performs the failure classification with respect to the unique FBM of the layer z.

(Step S607) The variable z is increased by 1.

(Step S608) When z is larger than n, the process proceeds to step S609. When z is equal to or smaller than n, the process returns to step S606.

By repeating steps S606 to S608, the two-dimensional failure classification is performed with respect to the unique FBMs of all of the layers.

(Step S609) The layer combination determining unit 317 refers to the layer combination rule, detects and classifies the failures crossing the layers from the unique FBM failure classification result of each layer obtained in steps S606 to S608, and stores the failure classification result in the main memory 130. In this case, since the process is the same as that of the first embodiment (refer to FIG. 5), the description will not be repeated.

(Step S610) The two-dimensional FBM failure classifying unit 315 classifies the failure of the layer common FBM.

(Step S611) The failure name converting unit 316 refers to the conversion table to convert the two-dimensional failure classification name based on the failure classification in step S610 into a three-dimensional failure classification name, and stores the failure classification name as the layer common FBM failure classification result in the main memory 130.

(Step S612) The synthesizing unit 318 synthesizes the failure classification result based on the layer combination determining unit 317 and the layer common failure classification result.

(Step S613) The synthesizing unit 318 outputs the synthesized failure classification result and stores the synthesized failure classification result in the disk device 120.

In this embodiment, the synthesizing unit 318 refers to the layer combination rule and synthesizes the failure classification result of the detection and classification of the failures crossing the layers and the layer common failure classification result based on the layer common FBM, from the failure classification results (failure classification result of the layer 1, failure classification result of the layer 2, . . . , and failure classification result of the layer n) based on the unique FBMs of the individual layers. Thereby, the detection and classification of the failures crossing the layers can be performed with even higher precision.

Figure 17:
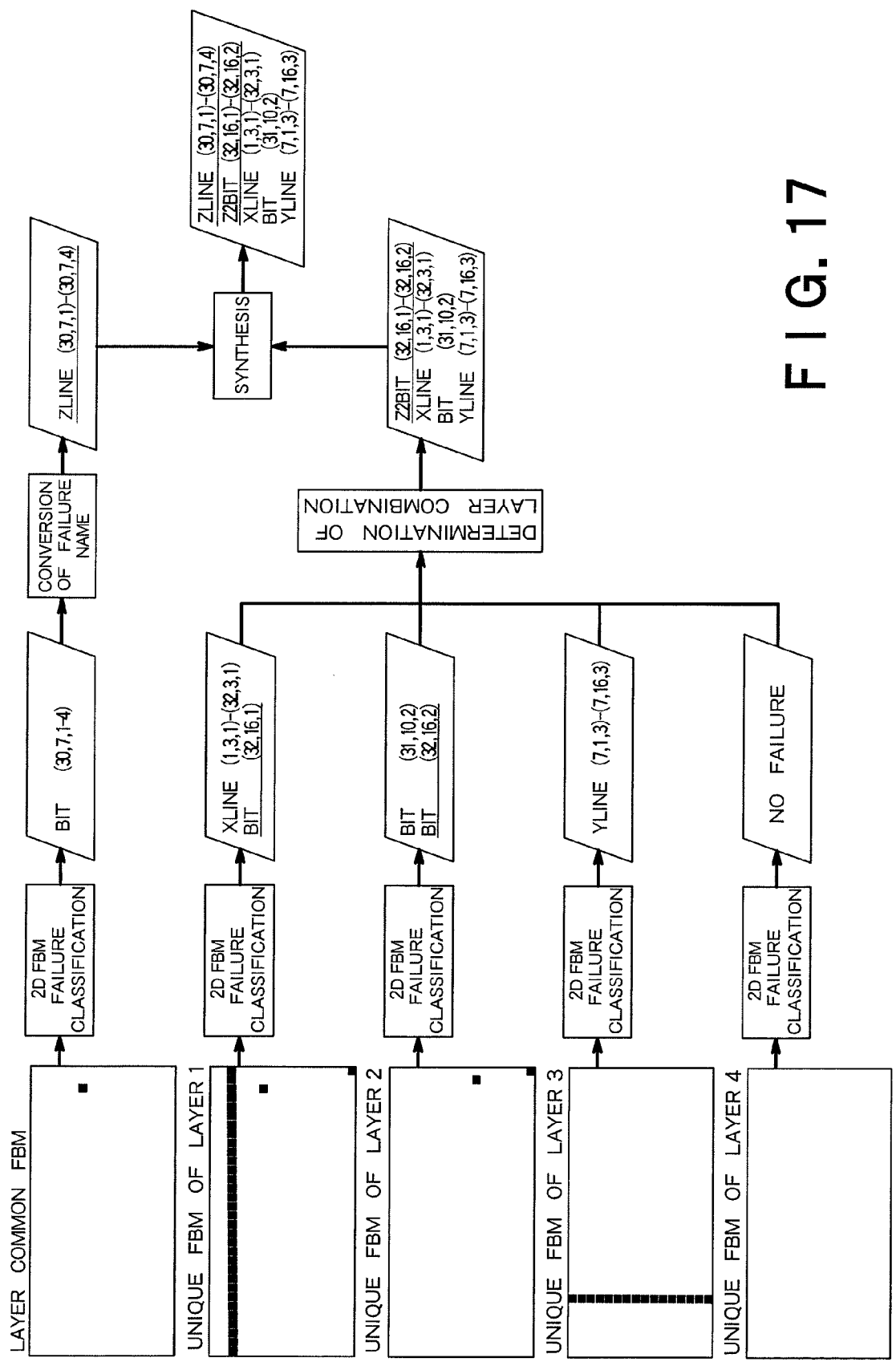
FIG. 17 is a diagram showing an example of a failure classification according to the third embodiment.

An example of the detection of the failures crossing the layers according to this embodiment will be described using FIG. 17. For simplification of description, it is assumed that the FBM is divided into four layers (layer 1, layer 2, layer 3, and layer 4).

The layer common FBM extracting unit 313 extracts the unique FBMs (layer 1 unique FBM, layer 2 unique FBM, layer 3 unique FBM, and layer unique FBM) of the individual layers, from the FBMs divided from each layer.

The two-dimensional FBM failure classifying unit 315 classifies the failure of the layer common FBM and the unique FBM of each layer.

The failure classification result of the layer common FBM is one of BIT (30, 7, 1-4). The failure name converting unit 316 refers to the conversion table shown in FIG. 10 and converts the failure name from BIT (30, 7, 1-4) to ZLINE (30, 7, 1)-(30, 7, 4).

The failure classification results of the unique FBM of the layer 1 are two of XLINE (1, 3, 1)-(32, 3, 1) and BIT (32, 16, 1). The failure classification results of the unique FBM of the layer 2 are two of BIT (31, 10, 2) and BIT (32, 16, 2). The failure classification result of the unique FBM of the layer 3 is one of YLINE (7, 1, 3)-(7, 16, 3). The failure does not exist in the unique FBM of the layer 4.

Next, the layer combination determining unit 317 refers to the layer combination rule shown in FIG. 4 and detects and classifies the failures crossing the layers from the unique FBM of each layer.

Since the XLINE (1, 3, 1)-(32, 3, 1) of the unique FBM of the layer 1 does not correspond to the base point failure of the combination rule, this is excluded from the combination failure. The BIT (32, 16, 1) of the unique FBM of the layer 1 corresponds to the base point failure of the rule number 1, the rule number 2, and the rule number 3. However, only the rule number 2 is matched with the combination rule and the association failure becomes BIT (32, 16, 1) of the layer 2. These are grouped, are newly added with a combination failure name of Z2BIT, and are classified as Z2BIT (32, 16, 1)-(32, 16, 2). The BIT (32, 16, 1) of the base point failure and BIT (32, 16, 2) of the association failure where the deletion flag is fixed are deleted.

The BIT (31, 10, 2) of the unique FBM of the layer 2 does not correspond to the base point failures of the rule number 1, the rule number 2, and the rule number. However, the association failure matched with the combination condition does not exist and this is excluded from the combination failure object.

Since the BIT (32, 16, 2) of the unique FBM of the layer 2 is deleted as described above, this becomes the combination failure object.

The YLINE (7, 1, 3)-(7, 16, 3) of the unique FBM of the layer 3 does not correspond to the base point failure of the rule number 4. However, the association failure matched with the combination condition does not exist and this is excluded from the combination failure object.

The synthesizing unit 318 synthesizes the failure classification results and outputs the synthesized results as a (final) failure classification result including ZLINE (30, 7, 1)-(30, 7, 4), Z2BIT (32, 16, 1)-(32, 16, 2), XLINE (1, 3, 1)-(32, 3, 1), BIT (31, 10, 2), and YLINE (7, 1, 3)-(7, 16, 3). The failure classification result that is output from the synthesizing unit 318 is stored in the disk device 120.

As such, in this embodiment, the synthesizing unit refers to the layer combination rule and synthesizes the failure classification result of the detection and classification of the failures crossing the layers and the layer common failure classification result based on the layer common FBM, from the failure classification results (failure classification result of the layer 1, failure classification result of the layer 2, . . . , and failure classification result of the layer n) based on the unique FBMs of the individual layers.

This embodiment uses the layer common FBM and can the number of failures that performs the collation with the layer combination rule, as compared with the first embodiment. Therefore, the processing time can be shortened. The failures crossing the layers are detected and classified from the failure classification result based on the unique FBM of each layer, while the layer combination rule is referred to. Therefore, as compared with the second embodiment, the detection and classification of the failures crossing the layers can be performed with even higher precision.

At least part of the failure analyzing device described in the above embodiments may be implemented in either hardware or software. When implemented in software, a program that realizes at least part of functions of the failure analyzing device may be stored on a recording medium such as a flexible disk or CD-ROM and read and executed by a computer. The recording medium is not limited to a removable recording medium such as a magnetic disk or optical disk, but may be a non-removable recording medium such as a hard disk device or memory.

The program that realizes at least part of the functions of the failure analyzing device may be distributed through a communication line (including wireless communications) such as the Internet. Further, the program may be encrypted, modulated, or compressed to be distributed through a wired line or wireless line such as the Internet or to be distributed by storing the program on a recording medium.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A failure analyzing device, comprising:
a dividing unit that receives a fail bit map where non-failure/failure information of individual cells of a semiconductor memory is arranged in order of physical addresses corresponding to a physical layout of the memory cells, and divides the fail bit map for each layer;
a classifying unit that classifies a failure type in the fail bit map corresponding to each layer;
a storage unit that stores a rule where the failed cells of different layers are combined as the same failure type; and
a determining unit that determines whether classification results based on the classifying unit are matched with the rule and groups the matched classification results,
wherein the rule includes a base point failure, an association failure becoming a combination object of the base point failure, a combination condition defining a relationship between the base point failure and the association failure, and a combination failure name, and
the determining unit extracts the base point failure from the classification result of one layer, extracts the association failure matched with the combination condition from the classification results of the other layers, groups the extracted base point failure and association failure, and provides the combination failure name.

2. The failure analyzing device according to claim 1, wherein, when a deletion flag is added to the extracted association failure, the determining unit deletes the association failure according to the grouping of the base point failure and the association failure.

3. A failure analyzing device, comprising:
a dividing unit that receives a fail bit map where non-failure/failure information of individual cells of a semiconductor memory is arranged in order of physical addresses corresponding to a physical layout of the memory cells, and divides the fail bit map for each layer;
a first extracting unit that extracts a failed cell common to layers of a predetermined number or more, from the divided fail bit maps, and generates a layer common fail bit map;
a second extracting unit that extracts a unique failed cell of each layer from the fail bit map of each layer and generates a layer unique fail bit map;
a classifying unit that classifies a failure type in the layer common fail bit map and classifies a failure type in the layer unique fail bit map corresponding to each layer;
a storage unit that stores a table where a correspondence relationship between a name of the failure type in the layer common fail bit map and a three-dimensional failure type name is defined;
a converting unit that refers to the table, converts a failure name of a classification result of the layer common fail bit map based on the classifying unit into the three-dimensional failure type name, and generates a layer common failure classification result; and
a synthesizing unit that synthesizes the classification result of the layer unique fail bit map based on the classifying unit and the layer common failure classification result.

4. The failure analyzing device according to claim 3, wherein the first extracting unit calculates logical multiplication of the fail bit maps corresponding to all of the layers and generates the layer common fail bit map.

5. The failure analyzing device according to claim 4,
wherein the storage unit stores a rule where the failed cells of the different layers are combined as the same failure type,
the failure analyzing device further comprises a determining unit that determines whether the classification result of the layer unique fail bit map based on the classifying unit is matched with the rule and groups the matched classification result, and
the synthesizing unit synthesizes the grouped classification result and the layer common failure classification result.

6. The failure analyzing device according to claim 5,
wherein the rule includes a base point failure, an association failure becoming a combination object of the base point failure, a combination condition defining a relationship between the base point failure and the association failure, and a combination failure name, and
the determining unit extracts the base point failure from the classification result of the layer unique fail bit map of one layer, extracts the association failure matched with the combination condition from the classification results of the layer unique fail bit maps of the other layers, groups the extracted base point failure and association failure, and provides the combination failure name.

7. The failure analyzing device according to claim 3,
wherein the storage unit stores a rule where the failed cells of the different layers are combined as the same failure type,
the failure analyzing device further comprises a determining unit that determines whether the classification result of the layer unique fail bit map based on the classifying unit is matched with the rule and groups the matched classification result, and
the synthesizing unit synthesizes the grouped classification result and the layer common failure classification result.

8. The failure analyzing device according to claim 7,
wherein the rule includes a base point failure, an association failure becoming a combination object of the base point failure, a combination condition defining a relationship between the base point failure and the association failure, and a combination failure name, and
the determining unit extracts the base point failure from the classification result of the layer unique fail bit map of one layer, extracts the association failure matched with the combination condition from the classification results of the layer unique fail bit maps of the other layers, groups the extracted base point failure and association failure, and provides the combination failure name.

9. A failure analyzing method, comprising:
receiving a fail bit map where non-failure/failure information of individual cells of a semiconductor memory is arranged in order of physical addresses corresponding to a physical layout of the memory cells;
dividing the fail bit map for each layer;
classifying a failure type in the fail bit map corresponding to each layer; and
determining whether a classification result of the failure type is matched with a rule where the failed cells of different layers are combined as the same failure type and grouping the matched classification result,
wherein the rule includes a base point failure, an association failure becoming a combination object of the base point failure, a combination condition defining a relationship between the base point failure and the association failure, and a combination failure name, and
the grouping of the classification result includes extracting the base point failure from the classification result of one layer, extracting the association failure matched with the combination condition, from the classification results of the other layers, and grouping the extracted base point failure and association failure and providing the combination failure name.

10. The failure analyzing method according to claim 9,
wherein, when a deletion flag is added to the extracted association failure, the association failure is deleted according to the grouping of the base point failure and the association failure.

11. A failure analyzing method, comprising:
receiving a fail bit map where non-failure/failure information of individual cells of a semiconductor memory is arranged in order of physical addresses corresponding to a physical layout of the memory cells;
dividing the fail bit map for each layer;
extracting a failed cell common to layers of the predetermined number or more, from the divided fail bit maps, and generating a layer common fail bit map;
extracting a unique failed cell of each layer from the fail bit map of each layer and generating a layer unique fail bit map;
classifying a failure type in the layer common fail bit map;
classifying a failure type in the layer unique fail bit map corresponding to each layer;
referring to a table where a correspondence relationship between a name of the failure type in the layer common fail bit map and a three-dimensional failure type name is defined, converting a failure name of a classification result of the failure type in the layer common fail bit map into the three-dimensional failure type name, and generating a layer common failure classification result; and
synthesizing the classification result of the failure type in the layer unique fail bit map and the layer common failure classification result.

12. The failure analyzing method according to claim 11,
wherein logical multiplication of the fail bit maps corresponding to all of the layers is calculated and the layer common fail bit map is generated.

13. The failure analyzing method according to claim 11, further comprising:
referring to a rule including a base point failure, an association failure becoming a combination object of the base point failure, a combination condition defining a relationship between the base point failure and the association failure, and a combination failure name, extracting the base point failure from the classification result of the layer unique fail bit map of one layer, extracting the association failure matched with the combination condition from the classification results of the layer unique fail bit maps of the other layers, grouping the extracted base point failure and association failure, and providing the combination failure name,
wherein the base point failure and the association failure where the combination failure name is provided are synthesized with the layer common failure classification result.

* * * * *